United States Patent
Hinck et al.

(10) Patent No.: US 9,536,863 B2
(45) Date of Patent: Jan. 3, 2017

(54) INTERCONNECTION OF A PACKAGED CHIP TO A DIE IN A PACKAGE UTILIZING ON-PACKAGE INPUT/OUTPUT INTERFACES

(75) Inventors: Todd A. Hinck, Arlington, MA (US); Zuoguo Wu, San Jose, CA (US); Aaron Martin, El Dorado Hills, CA (US); Andrew W. Martwick, Portland, OR (US); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 504 days.

(21) Appl. No.: 13/994,919

(22) PCT Filed: Dec. 22, 2011

(86) PCT No.: PCT/US2011/067010
§ 371 (c)(1),
(2), (4) Date: Jun. 17, 2013

(87) PCT Pub. No.: WO2013/095561
PCT Pub. Date: Jun. 27, 2013

(65) Prior Publication Data
US 2013/0313709 A1    Nov. 28, 2013

(51) Int. Cl.
*G06F 13/12* (2006.01)
*G06F 13/38* (2006.01)
(Continued)

(52) U.S. Cl.
CPC ......... *H01L 25/0655* (2013.01); *G06F 13/385* (2013.01); *H04B 1/40* (2013.01);
(Continued)

(58) Field of Classification Search
None
See application file for complete search history.

(56) References Cited

U.S. PATENT DOCUMENTS

| | | | |
|---|---|---|---|
| 6,549,971 B1 | 4/2003 | Cecchi et al. | |
| 7,205,787 B1 * | 4/2007 | Massoumi et al. | 326/30 |

(Continued)

FOREIGN PATENT DOCUMENTS

| | | |
|---|---|---|
| CN | 1902822 | 1/2007 |
| TW | 200737714 | 10/2007 |

(Continued)

OTHER PUBLICATIONS

"A 10-Gb/s Compact Low-Power Serial I/O With DFE-IIR Equalization in 65-nm CMOS", Byungsub et al; Date: Dec. 2009; vol. 44, No. 12, pp. 3526-3538, 13 pages; Publisher: IEEE.*

(Continued)

*Primary Examiner* — Henry Tsai
*Assistant Examiner* — Christopher Bartels
(74) *Attorney, Agent, or Firm* — Blakely, Sokoloff, Taylor & Zafman LLP

(57) ABSTRACT

Apparatuses for interconnecting integrated circuit dies. A first set of single-ended transmitter circuits are included on a first die. The transmitter circuits are impedance matched and have no equalization. A first set of single-ended receiver circuits are included on a second die. The receiver circuits have no termination and no equalization. Conductive lines are coupled between the first set of transmitter circuits and the first set of receiver circuits. The lengths of the conductive lines are matched. The first die, the first set of single-ended transmitter circuits, the second die, the first set of single ended receiver circuits and the conductive lines are disposed within a first package. A second set of single-ended transmitter circuits are included on the first die. The transmitter circuits are impedance matched and have no equalization. Data transmitted from the second set of transmitter circuits is transmitted according to a data bus inversion (DBI) scheme. A second set of single-ended receiver circuits is (Continued)

included on a third die. The receiver circuits have termination. Conductive lines are coupled between the second set of transmitter circuits and the second set of receiver circuits. The lengths of the conductive lines are matched and the second set of receiver circuits is disposed within a second package.

16 Claims, 5 Drawing Sheets

(51) Int. Cl.
  *H01L 25/065* (2006.01)
  *H04B 1/40* (2015.01)
  *H01L 23/538* (2006.01)
  *H01L 23/48* (2006.01)
  *H01L 23/66* (2006.01)
  *H01L 25/11* (2006.01)

(52) U.S. Cl.
  CPC .......... *H01L 23/48* (2013.01); *H01L 23/5383* (2013.01); *H01L 23/66* (2013.01); *H01L 25/115* (2013.01); *H01L 2224/16145* (2013.01); *H01L 2224/16225* (2013.01); *H01L 2224/16227* (2013.01); *H01L 2924/15192* (2013.01); *H01L 2924/15311* (2013.01)

(56) References Cited

U.S. PATENT DOCUMENTS

| | | | | |
|---|---|---|---|---|
| 7,516,281 | B2* | 4/2009 | LaBerge | G06F 13/4086 711/105 |
| 8,930,647 | B1* | 1/2015 | Smith | 711/154 |
| 2001/0043568 | A1* | 11/2001 | McHale | H04L 12/2856 370/254 |
| 2003/0011500 | A1* | 1/2003 | Takeuchi | H03K 19/00361 341/155 |
| 2003/0087634 | A1 | 5/2003 | Raghavan et al. | |
| 2004/0006584 | A1* | 1/2004 | Vandeweerd | 709/107 |
| 2004/0057525 | A1* | 3/2004 | Rajan | G06F 13/4072 375/257 |
| 2004/0190349 | A1* | 9/2004 | Schreck | G11C 7/12 365/189.07 |
| 2005/0125577 | A1* | 6/2005 | Yusa | G09G 3/2092 710/62 |
| 2006/0109918 | A1 | 5/2006 | Brown | |
| 2007/0038789 | A1* | 2/2007 | Macri et al. | 710/105 |
| 2007/0194454 | A1* | 8/2007 | Hanawa | G11C 5/06 257/777 |
| 2007/0297520 | A1 | 12/2007 | Ho et al. | |
| 2008/0143379 | A1* | 6/2008 | Norman | H01L 23/50 326/39 |
| 2008/0253085 | A1* | 10/2008 | Soffer | 361/687 |
| 2009/0228624 | A1* | 9/2009 | Maldei et al. | 710/100 |
| 2011/0145777 | A1* | 6/2011 | Iyer et al. | 716/132 |
| 2011/0228864 | A1* | 9/2011 | Aryanfar et al. | 375/259 |
| 2012/0020142 | A1* | 1/2012 | Yu | G11C 8/10 365/148 |
| 2012/0120996 | A1* | 5/2012 | McCombs | 375/224 |
| 2014/0010032 | A1* | 1/2014 | Seshadri | G11C 7/12 365/203 |

FOREIGN PATENT DOCUMENTS

| | | |
|---|---|---|
| TW | 200807589 | 2/2008 |
| TW | 200849516 | 12/2008 |
| WO | 90/04316 | 4/1990 |

OTHER PUBLICATIONS

Official Letter and Search Report for Taiwan Patent Application No. 101143241 mailed Sep. 26, 2014, 6 pages.
International Search Report and Written Opinion for PCT/US2011/067010 mailed Aug. 30, 2012, 10 pages.
International Preliminary Report on Patentability for PCT/US2011/067010 mailed Jul. 3, 2014, 7 pages.
Translation of the First Office Action and Search Report from related Chinese Application No. 201180075643.7, mailed Jan. 27, 2016, 17 pages.

\* cited by examiner

US 9,536,863 B2

INTERCONNECTION OF A PACKAGED CHIP TO A DIE IN A PACKAGE UTILIZING ON-PACKAGE INPUT/OUTPUT INTERFACES

TECHNICAL FIELD

Embodiments of the invention relate to input/output architectures and interfaces. More particularly, embodiments of the invention relate to high-bandwidth on-package input/output architectures and interfaces.

BACKGROUND

High bandwidth interconnections between chips using conventional input/output (I/O) interfaces require significant power and chip area. Thus, in applications requiring smaller chip areas and/or reduced power consumption, these conventional interfaces are not desirable.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Described herein is an On-Package I/O (OPIO) interface that solves the problems of conventional I/O interfaces by providing very high bandwidth I/O between chips in a Multi Chip Package (MCP) with very low power, area and latency. OPIO may be useful, for example, to interconnect a processor to memory (eDRAM/DRAM), another process, a chip set, a graphics processor, or any other chip in a MCP with an order of magnitude lower energy per bit and area per bandwidth efficiencies compared to conventional I/O.

Various embodiments of the interfaces described herein include one or more of the following components: (1) a single-ended, high-speed I/O interface (e.g., CMOS interface) between IC chips in a MCP with a relatively small die-to-die gap; (2) an impedance matched transmitter (e.g., CMOS transmitter) with no termination or very weak termination, and no equalization; (3) a forwarded clock signal for a cluster of signals with length-matched routing to minimize or eliminate per pin de-skew; and/or (4) reduced electrostatic discharge (ESD) protection (e.g., 70 V) to provide lower pad capacitances and higher data rates.

Close chip assembly in MCP enables very short length matched I/O traces, which in turn enables OPIO architectures described herein to run at high bandwidth using simplified single-ended I/O and clocking circuits to reduce power, area and latency. In one embodiment, high-speed, single-ended I/O with minimum bump pitch reduces bump limited silicon area for required bandwidth.

In one embodiment, use of a CMOS transmitter and receiver with no or weak receiver termination and no equalization can reduce I/O power. Simplified clocking with forwarded clock per cluster of signals and no per pin de-skew can be achieved due to careful length matched routing reduces clock power. Thus, the OPIO architectures described herein provide high bandwidth between chips at very low power, area and latency. MCP with OPIO provides product, process and die area flexibility without significant power and area overhead. The OPIO architectures described herein can also be extended to close discrete packages with full ESD protection for small form factor mobile applications at lower data rates. Multi-level (e.g., M-PAM) signaling can be used at higher data rates to keep the clock frequency down.

Figure 1:
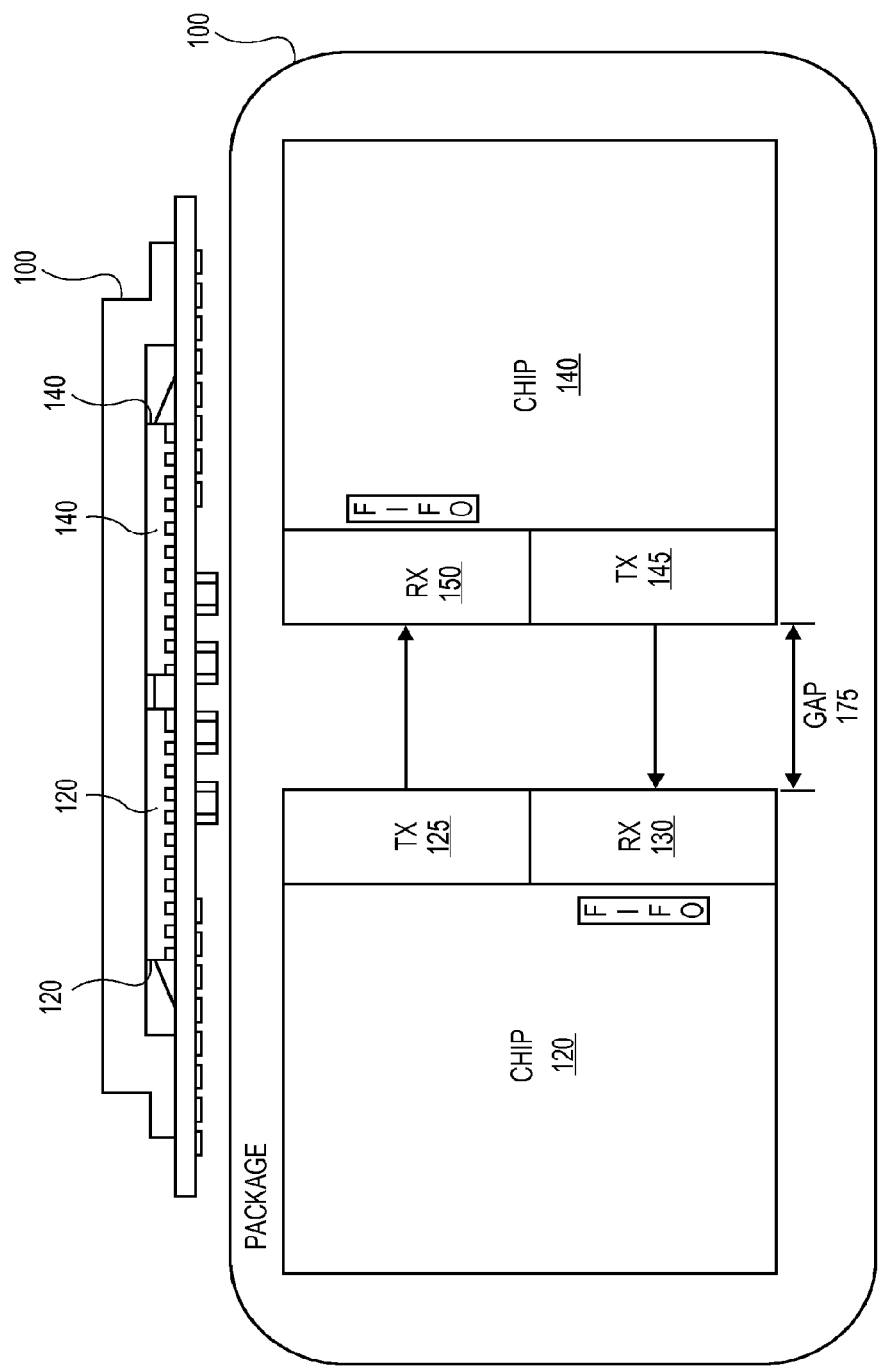
FIG. 1 is a block diagram of one embodiment of a multichip package (MCP) having on-package input/output (OPIO) interfaces between at least two chips.

FIG. 1 is a block diagram of one embodiment of a multichip package (MCP) having on-package input/output (OPIO) interfaces between at least two chips. The example of FIG. 1 illustrates two chips with interfaces; however, any number of chips within a package can be interconnected using the techniques described herein.

Package 100 may be any type of package that may contain multiple integrated circuit chips. In the example of FIG. 1, package 100 contains chip 120 and chip 140. These chips may be, for example, processors, memory chips, graphics processors, etc.

In one embodiment, chip 120 includes OPIO transmitters 125 and OPIO receivers 130. Similarly, chip 140 includes OPIO transmitters 145 and OPIO receivers 150. Transmitters 125 are coupled with receivers 150 and transmitters 145 are coupled with receivers 130.

In one embodiment, gap 175 between chip 120 and chip 140 is relatively small. In one embodiment, gap 175 is less than 20 mm. In one embodiment, gap 175 is less than 10 mm. In one embodiment, gap 175 is approximately 3 mm. In other embodiments, gap 175 may be less than 3 mm. In general, the smaller gap 175, the greater the bandwidth that may be provided between chips.

In one embodiment, the interfaces between transmitter 125 and receiver 150, and between transmitter 145 and receiver 130 are single-ended, relatively high-speed interfaces. In one embodiment, the interfaces are CMOS interfaces between chip 120 and chip 140. In one embodiment, transmitters 125 and 145 are impedance matched CMOS transmitters and no termination or equalization is provided. In one embodiment, transmitters 125 and 145 are impedance matched CMOS transmitters and very weak termination and no equalization is provided.

In one embodiment, a forwarded clock signal it transmitted for a cluster of signals. In one embodiment, length-matched routing is provided between the transmitters and the receivers. In one embodiment, minimal electrostatic discharge (ESD) protection (as little as 70 Volts) is provided for the interfaces between chips 120 and 140.

In one embodiment, use of a CMOS transmitter and receiver with no or weak receiver termination and no equalization can reduce I/O power. Simplified clocking with forwarded clock per cluster of signals and no per pin de-skew can be achieved due to careful length matched routing reduces clock power. Thus, the architectures described herein provide high bandwidth between chips at very low power, area and latency.

The architectures described herein can also be extended to close discrete packages with full ESD protection for small form factor mobile applications at lower data rates. Multi-level (e.g., M-PAM) signaling can be used at higher data rates to keep the clock frequency down.

Connecting a processor die to an external memory die using conventional input/output (I/O) interfaces requires significant power and chip area, and may not provide sufficient bandwidth for high performance processor cache or memory within the budgeted power, area and/or latency. On-die cache memories can provide only partial solution.

The architecture described above may be utilized to connect, for example, a processor core on one die to a memory or cache on another die within a single package to provide very high bandwidth with low power consumption. The memory may be, for example, a dynamic random access memory (DRAM), an embedded DRAM (eDRAM), stacked DRAM, non-volatile memory (e.g., flash memory, phase change memory (PCM)), etc. In one embodiment, the interfaces described herein may provide an order of magnitude lower energy per bit and area per bandwidth efficiencies as compared to traditional I/O interfaces.

Various embodiments of the architectures described herein may include one or more of the following. A processor die and one or more memory dice (e.g., DRAM, eDRAM, stacked DRAM, flash, PCM) connected using a high bandwidth, low power interface, for example, the interface described with respect to FIG. 1. In one embodiment, multiple memory devices (e.g., DRAM, eDRAM, stacked DRAM, flash, PCM) may be connected to a single high bandwidth, low power interface. In one embodiment, a logic circuit may be used to combine multiple lower bandwidth connection, for example, multiple through silicon via (TSV) interfaces into a single high bandwidth, low power interface. In another embodiment, the memory devices may be, for example, stacked DRAM nor stacked non-volatile memory.

Close assembly of the processor die and one or more memory or cache dice within a multi-chip package may support a short, length matched I/O interfaces that enables high bandwidth, low power transmission using a high-speed 1/0 interface. These interfaces may use simplified single-ended lines and clocking circuits that reduce power, area and latency. High-speed single-ended I/O interfaces with minimum bump pitch reduces bump limited silicon area for the supported bandwidth. Simplified clocking with a forwarded clock per cluster of signals can provide no per-pin deskew due to length-matched routing that reduces clock power.

The interface of FIG. 1 is optimized to operate between two dies that are relatively closely positioned within a package. However, there may be a need to couple a die with a packaged component to also reside within the package housing chip 120 and chip 140. When providing an interface to a packaged die, different physical characteristics must be considered.

The interfaces described herein can provide a high bandwidth, low power to connect a packaged die to, for example, a memory device (dynamic random access memory (DRAM), stacked DRAM) that may sit within the package. In one embodiment, one or more dies may be packaged before assembled within another package. The package may be, for example a ball grid array (BGA) package or a wafer-level package.

Due to the additional packaging, these devices may experience higher crosstalk as compared to unpackaged embedded DRAM (eDRAM) and longer channels to accommodate the memory stack outside an integrated heat spreader. The interfaces that follow may be built upon the OPIO architecture described above to allow channels with higher crosstalk and longer lengths, while maintaining the high bandwidth, low power nature of the in-package interconnect.

Figure 2:
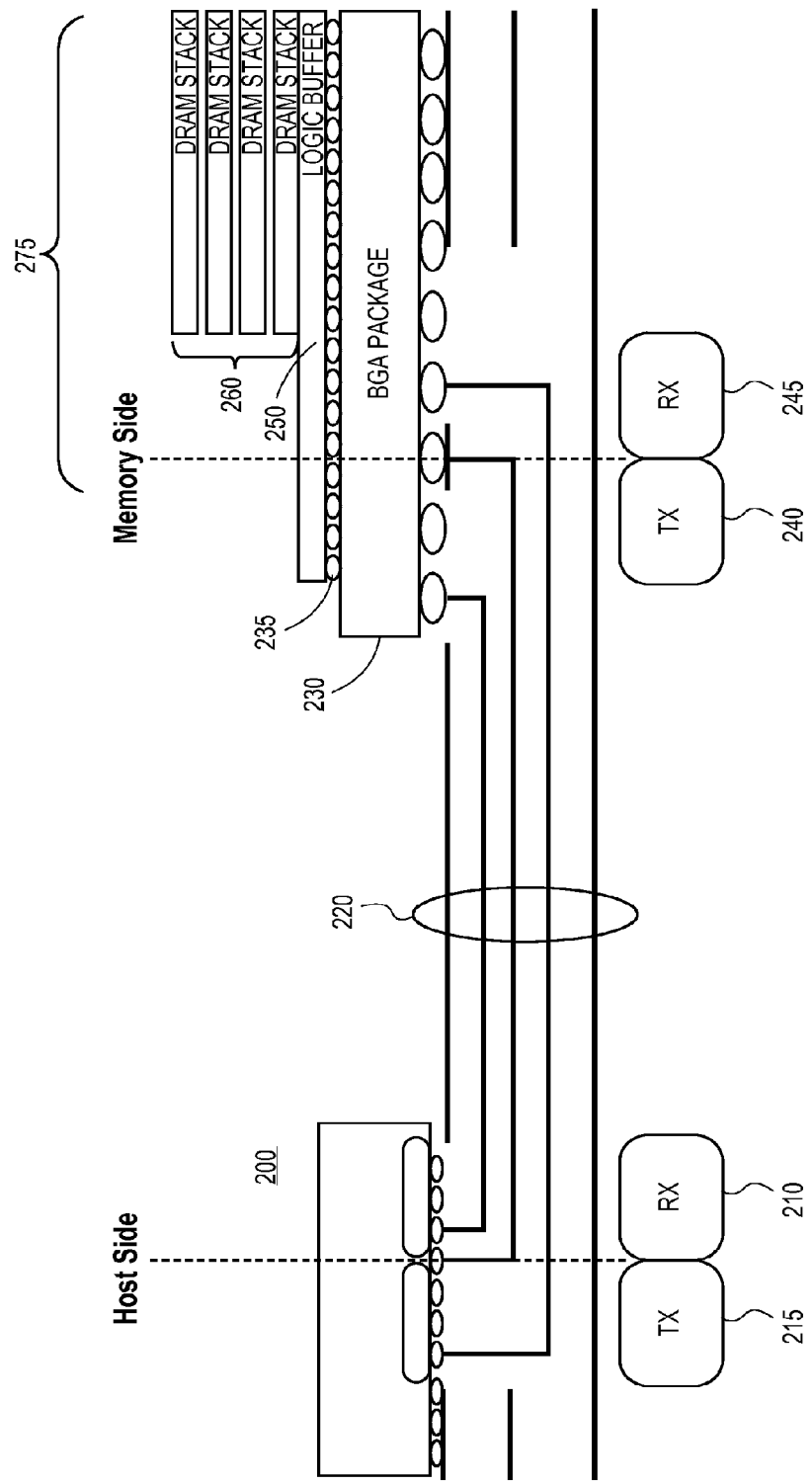
FIG. 2 is a block diagram of one embodiment of an interface between packaged components.

FIG. 2 is a block diagram of one embodiment of an interface between packaged components. The example of FIG. 2 include a host (e.g., a processor) in one package coupled with a device (e.g., one or more memory components) that are housed in a separate package. The interface of FIG. 1 is generally utilized within a single package; however, similar concepts can be applied to the interface between packages.

The interface of FIG. 2 provides a high-bandwidth, low-power interface and architecture between host 200 and device 275. In one embodiment, one or more components within device 275 may utilize the interface of FIG. 1. The example of FIG. 2 includes a stacked memory device; however, other types of devices can also be supported.

In the example of FIG. 2, host 200 and device 275 are packaged separately. The packages may be, for example ball grid array (BGA) packages or wafer-level packages that may be assembled on or within another package. Due to the additional packaging, these devices may suffer from increased crosstalk and longer channels. The architecture of FIG. 2 supports these channels while maintaining a high-bandwidth, low-power interface similar to the interface of FIG. 1.

In one embodiment, the interface of FIG. 2 includes a tuneable source-terminated receiver, data bus inversion (DBI) encoding of data/commands, a sense amplifier receiver, and/or a differential forwarded clock (to over come clock noise and receiver training).

In one embodiment, host 200 includes transmitter 215 and receiver 210 that are coupled with device 275 through a package interface (e.g., BGA) and lines 220. Device package 230 includes counterpart receiver 245 and transmitter 240 coupled with lines 220.

In one embodiment, transmitter 240 and receiver 245 are coupled with lines 220 through package interface 235. Package interface 235 provides an interface between package 230 and logic buffer 250. In one embodiment, logic buffer 250 is coupled with DRAM stack 260 utilizing the interface described with respect to FIG. 1.

Figure 3:
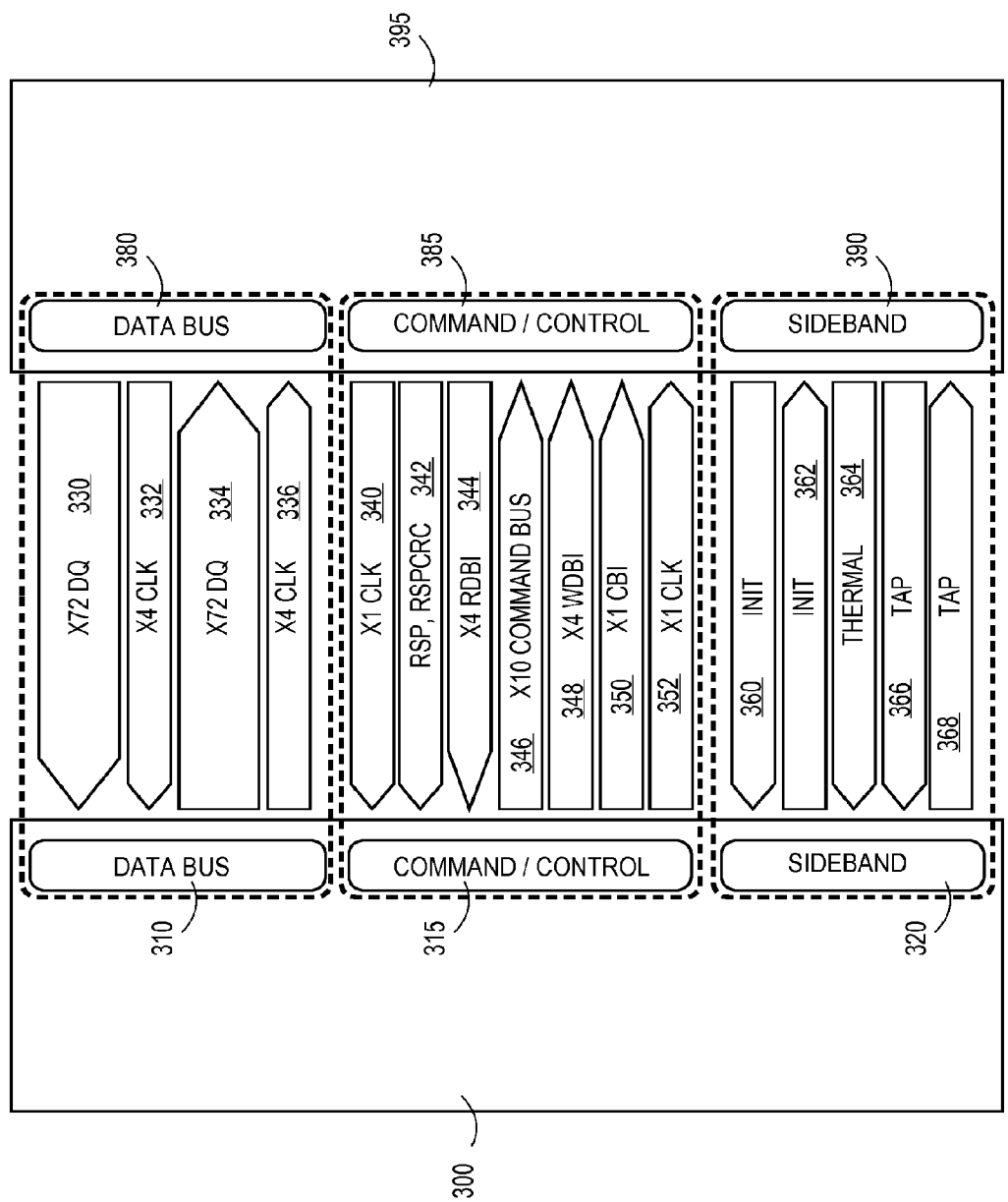
FIG. 3 is one embodiment of connections within an interface between components.

FIG. 3 is one embodiment of connections within an interface between components. The example of FIG. 3 is but one configuration. Many other alternative may also be supported using the concepts described herein. In one embodiment, the configuration of FIG. 3 may be used with the interface of FIG. 2; however, it may also be used with the interface of FIG. 1.

Processor 300 may have transmitters and receivers corresponding to data bus 310, command/control bus 315 and sideband bus 320. Device 395 also has corresponding transmitters and receivers for data bus 380, command/control bus 385 and sideband bus 390.

In one embodiment, the data bus may include 72 data lines, 330, and four clock lines, 332, from device 395 to processor 300 and 72 data lines, 334, and four clock lines, 336, from processor 300 to device 395. The data lines and/or clock lines may be organized as clusters. In alternate embodiments, a different number of data lines and/or clock lines may be supported.

In one embodiment, the command/control bus may include a clock line, 340, a parity/correction lines, 342, and four read DBI lines, 344, from device 395 to processor 300 and four write DBI lines, 348, one CBI line, 350 and one clock line, 352, from processor 300 to device 395. In one embodiment, command bus 346 transmits commands from processor 300 to device 395. In alternate embodiments, a different number of lines may be supported.

In one embodiment, the sideband bus may INIT line, 362, and TAP line, 368, from device 395 to processor 300 and INIT line, 360, and thermal information line, 364, and TAP line, 366, from device 395 to processor 300. In alternate embodiments, a different number of sideband lines may be supported.

Figure 4:
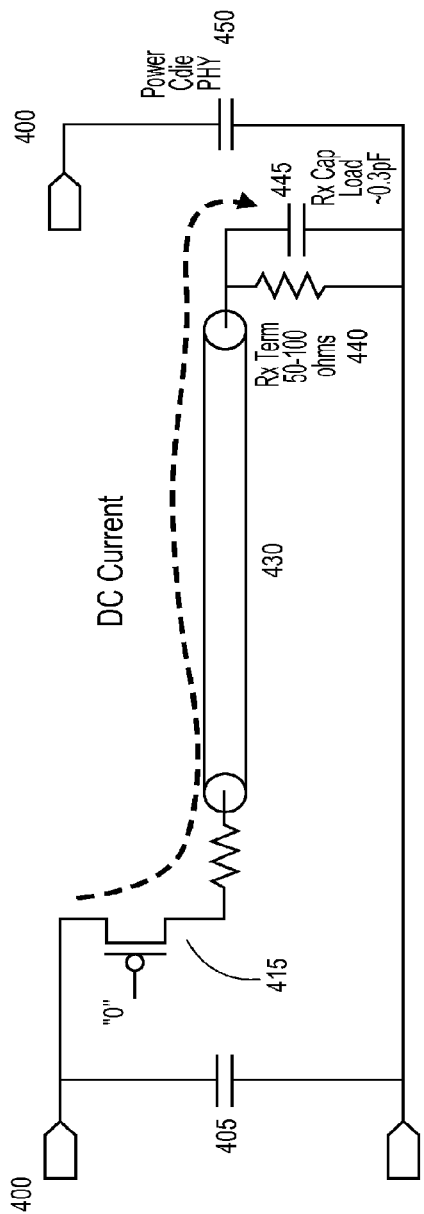
FIG. 4 is a circuit diagram of one embodiment of a termination arrangement for the interface discussed herein when current flows.

FIG. 4 is a circuit diagram of one embodiment of a termination arrangement for the interface discussed herein when current flows. FIG. 4 illustrates the condition when a low voltage is applied to the gate of transistor 415 to allow current to flow from supply source 400 through transmission line 430 to transmit a bit of information.

Resistor 440 represents the receiver termination and capacitor 445 represents the capacitive load of the receiver. In one embodiment, the receiver termination is in the range of 50 to 100 Ohms In one embodiment, the receiver termination is tunable. The receiving device also includes power source 400 and capacitor 450 represents the capacitance of the device. The receiving device also includes power source 400 and capacitors 405 and 450 represent the capacitance of the I/O power network.

Figure 5:
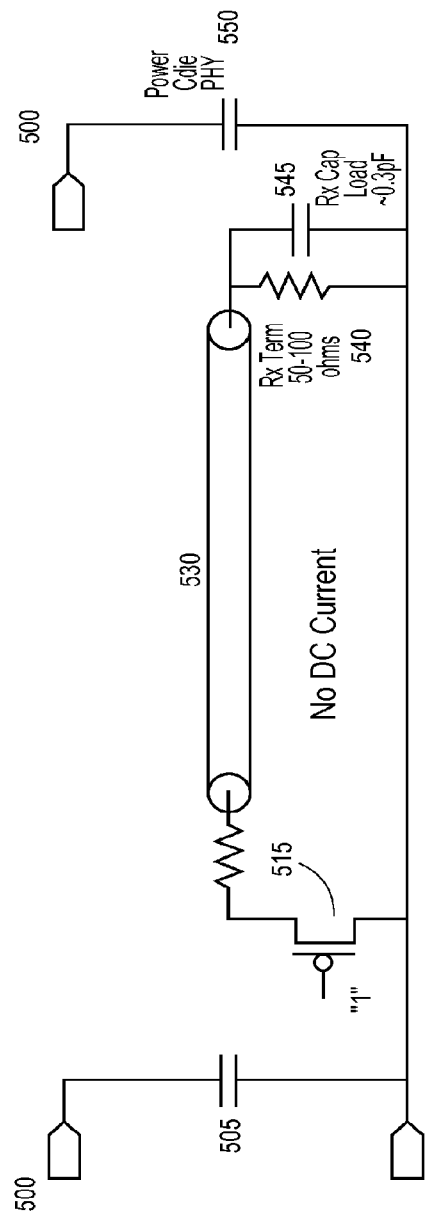
FIG. 5 is a circuit diagram of one embodiment of a termination arrangement for the interface discussed herein when no current flows.

FIG. 5 is a circuit diagram of one embodiment of a termination arrangement for the interface discussed herein when no current flows. FIG. 5 illustrates the condition when a high voltage is applied to the gate of transistor 515 to prevent current from flowing from supply source 500 through transmission line 530 to transmit a bit of information.

Resistor 540 represents the receiver termination and capacitor 545 represents the capacitive load of the receiver. In one embodiment, the receiver termination is in the range of 50 to 100 Ohms In one embodiment, the receiver termination is tunable. The receiving device also includes power source 500 and capacitor 550 represents the capacitance of the device. The receiving device also includes power source 500 and capacitors 505 and 550 represent the capacitance of the I/O power network.

In one embodiment a data bus inversion (DBI) scheme is utilized with the interfaces described herein. The DBI scheme can operate to reduce the overall power consumption of the interface. In one embodiment, the DBI scheme utilizes 18 bits per DBI bit so that a maximum of 9 lanes are switching at a time. Other DBI schemes may also be utilized.

In one embodiment, the clock signals that are forwarded over the interfaces described herein may be differential clock signals. This may provide lower power consumption and less complexity than use of a single-ended clock signal. In one embodiment, phase sampler training may be utilized with the interface.

Figure 6:
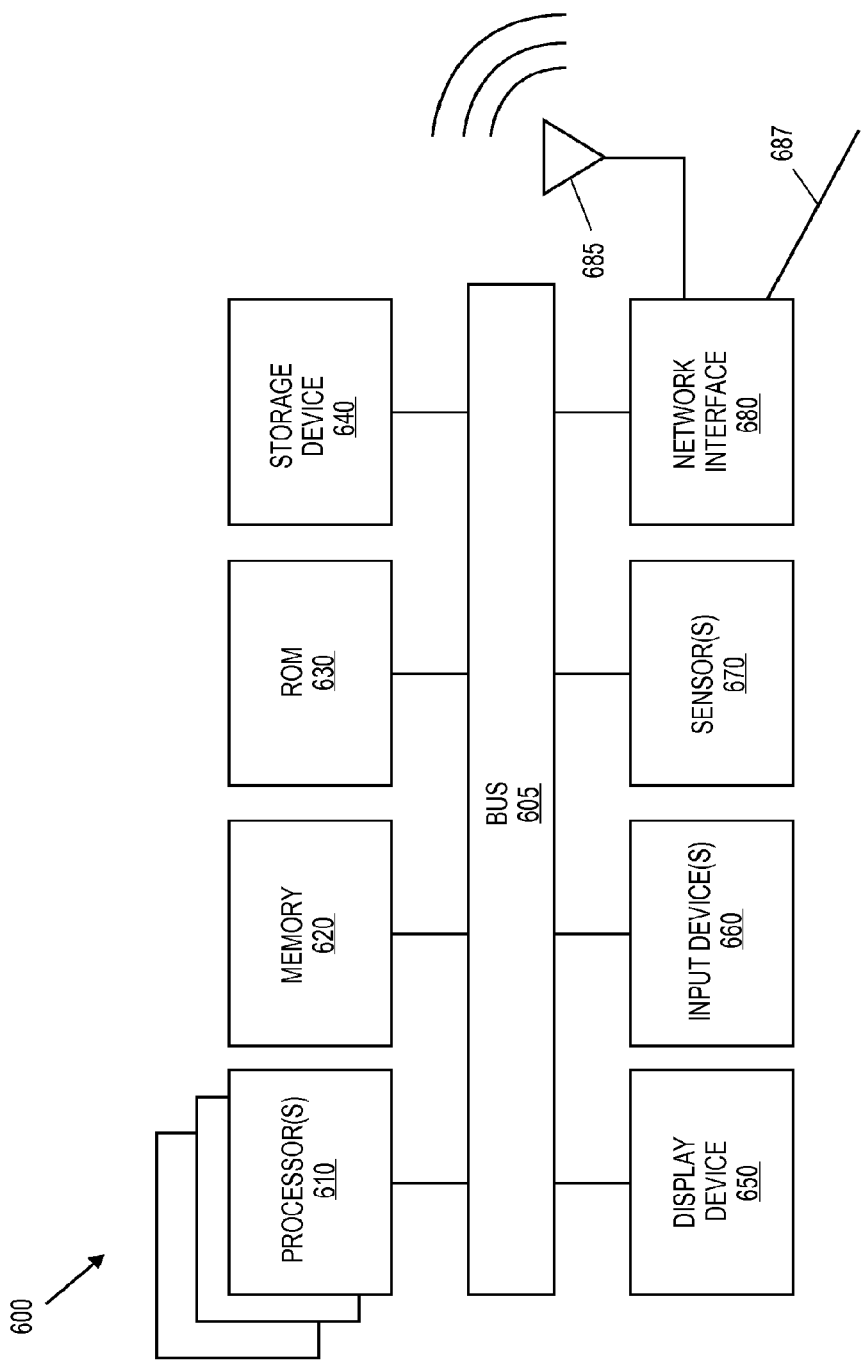
FIG. 6 is a block diagram of one embodiment of an electronic system.

FIG. 6 is a block diagram of one embodiment of an electronic system. The electronic system illustrated in FIG. 6 is intended to represent a range of electronic systems (either wired or wireless) including, for example, a tablet device, a smartphone, a desktop computer system, a laptop computer system, etc. Alternative electronic systems may include more, fewer and/or different components.

One or more of the components illustrated in FIG. 6 may be interconnected utilizing the OPIO architectures described herein. For example, multiple processor chips may be interconnected, or a processor and a cache memory or dynamic random access memory, etc.

Electronic system 600 includes bus 605 or other communication device to communicate information, and processor(s) 610 coupled to bus 605 that may process information. Electronic system 600 may include multiple processors and/or co-processors. Electronic system 600 further may include random access memory (RAM) or other dynamic storage device 620 (referred to as memory), coupled to bus 605 and may store information and instructions that may be executed by processor 610. Memory 620 may also be used to store temporary variables or other intermediate information during execution of instructions by processor(s) 610.

Electronic system 600 may also include read only memory (ROM) and/or other static storage device 630 coupled to bus 605 that may store static information and instructions for processor 610. Data storage device 640 may be coupled to bus 605 to store information and instructions. Data storage device 640 such as a magnetic disk or optical disc and corresponding drive may be coupled to electronic system 600.

Electronic system 600 may also be coupled via bus 605 to display device 650, which can be any type of display device, to display information to a user, for example, a touch screen. Input device 660 may be any type of interface and/or device to allow a user to provide input to electronic system 600. Input device may include hard buttons and/or soft buttons, voice or speaker input, to communicate information and command selections to processor(s) 610.

Electronic system 600 may further include sensors 670 that may be used to support functionality provided by Electronic system 600. Sensors 670 may include, for example, a gyroscope, a proximity sensor, a light sensor, etc. Any number of sensors and sensor types may be supported.

Electronic system 600 further may include network interface(s) 680 to provide access to a network, such as a local area network. Network interface(s) 680 may include, for example, a wireless network interface having antenna 685, which may represent one or more antenna(e). Network interface(s) 680 may also include, for example, a wired network interface to communicate with remote devices via network cable 687, which may be, for example, an Ethernet cable, a coaxial cable, a fiber optic cable, a serial cable, or a parallel cable.

In one embodiment, network interface(s) 680 may provide access to a local area network, for example, by conforming to IEEE 802.11b and/or IEEE 802.11g and/or IEEE 802.11n standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 6: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 680 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a first set of single-ended transmitter circuits on a first die, wherein the first set of single-ended transmitter circuits are impedance matched;
   a first set of single-ended receiver circuits on a second die, wherein the first set of single-ended receiver circuits have no termination;
   a first plurality of conductive lines between the first set of single-ended transmitter circuits and the first set of single-ended receiver circuits, wherein the lengths of the plurality of conductive lines are matched, wherein the first die, the first set of single-ended transmitter circuits, the second die, the first set of single ended receiver circuits and the first plurality of conductive lines are disposed within a first package and wherein an equalizer circuit does not exist along corresponding channels between the first die and the second die that flow through the first set of single-ended transmitter circuits, the first plurality of conductive lines and the first set of single-ended receiver circuits;
   a second set of single-ended transmitter circuits on the first die, wherein the second set of single-ended transmitter circuits are impedance matched, wherein data transmitted from the second set of single-ended transmitter circuits is transmitted according to a data bus inversion (DBI) scheme;
   a second set of single-ended receiver circuits on a third die, wherein the second set of single-ended receiver circuits have termination; and
   a second plurality of conductive lines between the second set of single-ended transmitter circuits and the second set of single-ended receiver circuits, wherein the lengths of the plurality of conductive lines are matched and the second set of single-ended receiver circuits and third die are disposed within a second package and wherein an equalizer circuit does not exist along corresponding channels between the first die and the third die that flow through the second set of single-ended transmitter circuits, the second plurality of conductive lines and the second set of single-ended receiver circuits.

2. The apparatus of claim 1 wherein the first package comprises a ball grid array (BGA) package.

3. The apparatus of claim 1 further comprising:
   a third set of single-ended receiver circuits on the first die, wherein the third set of single-ended receiver circuits have no termination and no equalization;
   a third set of single-ended transmitter circuits on the second die, wherein the third set of single-ended transmitter circuits are impedance matched and have no equalization; and
   a third plurality of conductive lines between the second set of transmitter circuits and the second set of receiver circuits, wherein the lengths of the third set of plurality of conductive lines are matched.

4. The apparatus of claim 1, wherein the first die comprises at least a processor core, the apparatus further comprising a touch screen interface coupled with the processor core.

5. The apparatus of claim 1 wherein a gap between the first die and the second die is less than 20 mm.

6. The apparatus of claim 5 wherein the gap is equal to or less than 1.5 mm.

7. A tablet computing device comprising:
   a touch screen interface;
   a first set of single-ended transmitter circuits on a first die, wherein the first-set of single ended transmitter circuits are impedance matched and have no equalization;
   a first set of single-ended receiver circuits on a second die, wherein the first-set of single ended receiver circuits have no termination and no equalization;
   a first plurality of conductive lines between the first set of single-ended transmitter circuits and the first set of single-ended receiver circuits, wherein the lengths of the plurality of conductive lines are matched, wherein the first die, the first set of single-ended transmitter circuits, the second die, the first set of single ended receiver circuits and the first plurality of conductive lines are disposed within a first package and wherein an equalizer circuit does not exist along corresponding channels between the first die and the second die that flow through the first set of single-ended transmitter circuits, the first plurality of conductive lines and the first set of single-ended receiver circuits;
   a second set of single-ended transmitter circuits on the first die, wherein the second set of single-ended transmitter circuits are impedance matched and have no equalization, wherein data transmitted from the second set of single-ended transmitter circuits is transmitted according to a data bus inversion (DBI) scheme;
   a second set of single-ended receiver circuits on a third die, wherein the second set of single-ended receiver circuits have termination; and
   a second plurality of conductive lines between the second set of single-ended transmitter circuits and the second set of single-ended receiver circuits, wherein the lengths of the plurality of conductive lines are matched and the second set of single-ended receiver circuits and third die are disposed within a second package and wherein an equalizer circuit does not exist along corresponding channels between the first die and the third die that flow through the second set of single-ended transmitter circuits, the second plurality of conductive lines and the second set of single-ended receiver circuits.

8. The tablet of claim 7 further comprising:
   a third set of single-ended receiver circuits on the first die, wherein the third set of single-ended receiver circuits have no termination and no equalization;

a third set of single-ended transmitter circuits on the second die, wherein the third set of single-ended transmitter circuits are impedance matched and have no equalization; and a third plurality of conductive lines between the second set of single-ended transmitter circuits and the second set of single-ended receiver circuits, wherein the lengths of the third plurality of conductive lines are matched.

9. The tablet of claim 7 further comprising an antenna for communication.

10. The tablet of claim 7 wherein a gap between the first die and the second die is less than 20 mm.

11. The tablet of claim 10 wherein the gap is equal to or less than 1.5 mm.

12. A system comprising:

an omnidirectional antenna;

a first set of single-ended transmitter circuits on a first die, wherein the first-set of single ended transmitter circuits are impedance matched and have no equalization;

a first set of single-ended receiver circuits on a second die, wherein the first-set of single ended receiver circuits have no termination and no equalization;

a first plurality of conductive lines between the first set of single-ended transmitter circuits and the first set of single-ended receiver circuits, wherein the lengths of the plurality of conductive lines are matched, wherein the first die, the first set of single-ended transmitter circuits, the second die, the first set of single ended receiver circuits and the first plurality of conductive lines are disposed within a first package and wherein an equalizer circuit does not exist along corresponding channels between the first die and the second die that flow through the first set of single-ended transmitter circuits, the first plurality of conductive lines and the first set of single-ended receiver circuits;

a second set of single-ended transmitter circuits on the first die, wherein the second set of single-ended transmitter circuits are impedance matched and have no equalization, wherein data transmitted from the second set of single-ended transmitter circuits is transmitted according to a data bus inversion (DBI) scheme;

a second set of single-ended receiver circuits on a third die, wherein the second set of single-ended receiver circuits have termination; and a second plurality of conductive lines between the second set of single-ended transmitter circuits and the second set of single-ended receiver circuits, wherein the lengths of the plurality of conductive lines are matched and the second set of single-ended receiver circuits and third die are disposed within a second package and wherein an equalizer circuit does not exist along corresponding channels between the first die and the third die that flow through the second set of single-ended transmitter circuits, the second plurality of conductive lines and the second set of single-ended receiver circuits.

13. The system of claim 12 further comprising:

a third set of single-ended receiver circuits on the first die, wherein the third set of single-ended receiver circuits have no termination and no equalization;

a third set of single-ended transmitter circuits on the second die, wherein the third set of single-ended transmitter circuits are impedance matched and have no equalization; and a third plurality of conductive lines between the second set of single-ended transmitter circuits and the second set of single-ended receiver circuits, wherein the lengths of the third plurality of conductive lines are matched.

14. The system of claim 12, wherein the first die comprises at least a processor core, the apparatus further comprising a touch screen interface coupled with the processor core.

15. The system of claim 12 wherein a gap between the first die and the second die is less than 20 mm.

16. The system of claim 15 wherein the gap is equal to or less than 1.5 mm.

* * * * *